United States Patent
Kolosnitsyn et al.

(10) Patent No.: US 11,296,310 B2
(45) Date of Patent: Apr. 5, 2022

(54) METHOD OF FORMING A METALLIC LITHIUM COATING

(71) Applicant: Sigma Lithium Limited, Abingdon (GB)

(72) Inventors: Vladimir Kolosnitsyn, Ufa (RU); Sergey Mochalov, Ufa (RU); Azat Nurgaliev, Ufa (RU); Aleksei Ivanov, Ufa (RU); Elena Kuzmina, Ufa (RU); Elena Karaseva, Ufa (RU)

(73) Assignee: SIGMA LITHIUM LIMITED, Abingdon (GB)

( * ) Notice: Subject to any disclaimer, the term of this patent is extended or adjusted under 35 U.S.C. 154(b) by 0 days.

(21) Appl. No.: 16/322,207

(22) PCT Filed: Aug. 2, 2017

(86) PCT No.: PCT/GB2017/052248
§ 371 (c)(1),
(2) Date: Jan. 31, 2019

(87) PCT Pub. No.: WO2018/025036
PCT Pub. Date: Feb. 8, 2018

(65) Prior Publication Data
US 2019/0190002 A1 Jun. 20, 2019

(30) Foreign Application Priority Data
Aug. 3, 2016 (RU) .................. RU2016131905

(51) Int. Cl.
*C23C 14/14* (2006.01)
*H01M 4/04* (2006.01)
(Continued)

(52) U.S. Cl.
CPC .......... *H01M 4/0426* (2013.01); *C23C 14/14* (2013.01); *C23C 14/3428* (2013.01);
(Continued)

(58) Field of Classification Search
CPC ..... C23C 14/14; C23C 14/3428; C23C 14/35; C23C 14/205; C23C 14/3485;
(Continued)

(56) References Cited

U.S. PATENT DOCUMENTS 5,015,493 A * 5/1991 Gruen ................ C23C 14/32
204/298.05
5,830,336 A * 11/1998 Schulz ............... C23C 14/185
204/298.12
(Continued)

FOREIGN PATENT DOCUMENTS

CN 1333574 1/2002
JP 62-70565 * 9/1985
(Continued)

OTHER PUBLICATIONS

Machine Translation JP 62-70565 (Year: 1985).*
(Continued)

*Primary Examiner* — Rodney G McDonald
(74) *Attorney, Agent, or Firm* — Wenderoth, Lind & Ponack, L.L.P.

(57) ABSTRACT

A method of forming a lithium coating on a substrate, the method comprising: melting a solid lithium target to form a molten lithium target; agitating the molten lithium target; vaporising at least part of the agitated molten lithium target to form a vaporised material; and condensing the vaporised material on a substrate to form a lithium coating.

18 Claims, 2 Drawing Sheets

(51) Int. Cl.
*C23C 14/34* (2006.01)
*C23C 14/35* (2006.01)
*H01M 4/134* (2010.01)
*H01M 4/1395* (2010.01)
*H01M 4/38* (2006.01)

(52) U.S. Cl.
CPC ........... *C23C 14/35* (2013.01); *H01M 4/0404* (2013.01); *H01M 4/0423* (2013.01); *H01M 4/134* (2013.01); *H01M 4/1395* (2013.01); *H01M 4/382* (2013.01)

(58) Field of Classification Search
CPC ............ H01M 4/0404; H01M 4/0423; H01M 4/0426; H01M 4/134
USPC ........................................ 204/192.12, 192.15
See application file for complete search history.

(56) References Cited

U.S. PATENT DOCUMENTS

| | | |
|---|---|---|
| 2002/0028383 A1 | 3/2002 | Kugai et al. |
| 2006/0123946 A1 | 6/2006 | Forbes Jones |
| 2007/0048170 A1 | 3/2007 | Fuchita et al. |
| 2014/0138242 A1 | 5/2014 | Neumann et al. |

FOREIGN PATENT DOCUMENTS

| | | |
|---|---|---|
| JP | 2007-063615 | 3/2007 |
| JP | 2010-111884 | 5/2010 |

OTHER PUBLICATIONS

International Search Report dated Nov. 14, 2017 in International Application No. PCT/GB2017/052248.
Written Opinion of the International Searching Authority dated Nov. 14, 2017 in International Application No. PCT/GB2017/052248.
S.A. Krat et al., "Deuterium release from lithium-deuterium films, deposited in the magnetron discharge", Vaccum, vol. 105, 2014, pp. 111-114, XP028658104.
Communication pursuant to Article 94(3) EPC dated Mar. 12, 2020, in corresponding European Patent Application No. 17761554.9.
Office Action dated Jun. 25, 2021, in corresponding Indian Patent Application No. 201917007597.
Notification of Reasons for Refusal dated Jan. 25, 2022, in corresponding Korean Patent Application No. 10-2019-7006157.

* cited by examiner

METHOD OF FORMING A METALLIC LITHIUM COATING

FIELD OF THE INVENTION

This invention relates to lithium coatings. In particular, though not exclusively, this invention relates to methods of applying lithium coatings to substrates and lithium coated substrates formed thereby.

BACKGROUND TO THE INVENTION

Lithium is used in a variety of fields, in particular in electrodes for batteries, due to its high specific energy.

Metallic lithium can easily be moulded into shape by pressing, extrusion and calendaring, due to its extremely soft and plastic nature. However, the resulting moulded metal has the disadvantage of low mechanical strength and extreme softness. It is therefore desirable to form a lithium coating on substrates, to increase the mechanical strength.

Physical vapour deposition (PVD) is a process used to deposit coatings of material on substrates. PVD processes comprise three steps: (a) vaporisation of material from a target, (b) transportation of the vaporised material, typically in a (partial) vacuum, to the substrate surface and (c) condensation of the vaporised material onto the substrate to generate a deposited coating. The two most common PVD techniques are thermal evaporation and sputtering. Thermal evaporation relies on vaporisation of the target material by heating the material. Sputtering creates vaporised material from the target through bombardment with accelerated gaseous ions.

Sputtering is a vaporisation process where surface atoms are physically ejected from a surface by momentum transfer from an energetic bombarding particle, e.g. a gaseous ion accelerated from a plasma. Thus sputtering can create vaporised material without thermal evaporation, though it may also occur together with thermal evaporation.

Lithium has a high chemical reactivity and is able to react with a great variety of substances, including atmospheric components such as oxygen, nitrogen and carbon dioxide. Thus, metallic lithium is easily passivated and, under normal conditions, contains on its surface a passivation layer made of lithium and components from the atmosphere.

The presence of a passivation layer on lithium poses particular challenges in the context of PVD of lithium because it makes it difficult to transfer the requisite vaporisation energy to metallic lithium targets. Passivation may occur on a lithium target used in PVD, hindering vaporisation and may also, undesirably, carry through to the vaporised material, condensation and coating.

Against this background, it is conventionally thought that PVD of metallic lithium must be carried out under high vacuum conditions to reduce atmospheric components and minimise passivation of lithium. This brings with it great inconvenience and high cost.

Magnetron sputtering is a type of PVD in which a plasma formed from a working gas is kept close to the surface of a target by use of a magnetic field. Collisions between ions of the working gas and the target surface cause material from the target surface to be ejected (as vaporised material) onto the substrate, causing the formation of a coating on the substrate.

Arcing during magnetron sputtering is a known problem which causes control and quality issues. Arcs form due to the build-up of charge at localised areas on the target, which create an intensely focused and localised discharge. A passivation layer on a lithium target can contribute to the problem of arcing. Arcing reduces the energy at the target, which results in a decrease in deposition onto the substrate.

During arcing, several negative effects take place. These include the magnetron deviating from its normal operation mode, changes in the working gas pressure in the chamber, and contamination of the working gas inside the chamber and of the coating by material from a passivation layer.

It is an object of the invention to address at least one of the above problems, or another problem associated with the prior art.

STATEMENTS OF THE INVENTION

Aspects of the invention relate to physical vapour deposition of lithium comprising agitation of a lithium target. Such agitation may advantageously help to disperse a passivation layer from the surface of the lithium target.

One aspect of the invention provides a method of forming a lithium coating on a substrate, the method comprising: melting a solid lithium target to form a molten lithium target; agitating the molten lithium target; vaporising at least part of the agitated molten lithium target to form vaporised material; and condensing the vaporised material on a substrate to form a lithium coating.

The lithium target comprises lithium, in particular metallic lithium. The lithium target may comprise a passivation layer. By melting and agitating the lithium target the disadvantageous effects of a passivation layer can be mitigated or substantially overcome. In particular, the passivation layer may be at least partly dispersed within the lithium target as a result of the agitation.

At least part of the solid lithium target may be molten to form the molten lithium target. To achieve melting, the temperature of the lithium target may be raised, e.g. by heating or ion bombardment, to melt solid lithium therein to form liquid lithium.

The molten lithium target comprises liquid lithium and may be agitated in any suitable manner. Advantageously, non-mechanical work, such as a magnetic field, may be applied to the molten lithium target to cause agitation of liquid lithium therein. A magnetic field may agitate the molten liquid target by inducing a magnetohydrodynamic (MHD) effect therein. Thus, agitating the molten lithium target may comprise creating a magnetohydrodynamic effect in the lithium target. However, other forms of work may also be used to achieve agitation.

Vaporisation, e.g. sputtering, of the lithium target may occur during melting and/or agitating the lithium target. However, in some embodiments of the invention vaporisation prior to agitation is advantageously reduced or substantially avoided.

Vaporisation of the agitated lithium target advantageously provides for increased purity of the vaporised material, particularly once any passivation layer is dispersed by agitation.

Furthermore, vaporisation is facilitated, helping to avoid arcing and leading to an increased deposition rate.

Vaporising at least part of the agitated lithium target may comprise thermal evaporation and/or bombardment of the target with energetic particles, such as accelerated gaseous ions, i.e. sputtering. The vaporised material may comprise or consist of particles ejected from the lithium target by sputtering.

Suitably, vaporisation may be effected by sputtering, for example magenetron sputtering.

In some embodiments, the invention provides a method of forming a lithium coating on a substrate, the method comprising: melting a solid lithium target to form a molten lithium target; agitating the molten lithium target; sputtering at least part of the agitated molten lithium target to eject material therefrom; and condensing the ejected material on a substrate to form a lithium coating.

A magnetic field may be created in proximity of the lithium target, for example using a magnetron arranged for magnetron sputtering of vaporised lithium from the target. The magnetic field may cause agitation of the lithium target. The magnetron may also be used to melt solid lithium in the lithium target by ion bombardment of the target.

Agitating the molten lithium target may comprise creating a magnetohydrodynamic effect (MHD) in the molten lithium target. A magnetron may be used to create the magnetohydrodynamic (MHD) effect in the molten lithium target.

The operation regime of the magnetron, for example the power of the magnetron discharge, may be selected to melt the lithium target. The operation regime or discharge power of the magnetron may be selected such that the magnetohydrodynamic effect causes a passivation film on the surface of the lithium target to be broken and removed from an area of its surface. For example, the passivation film may be removed from an area on the target surface where sputtering takes place.

The strength of magnetic field may be controlled by selecting the power of magnetron discharge from a magnetron. The operation regime of the magnetron may be selected to initiate in the molten lithium target mechanical movement (agitation) of lithium as a result of the MHD effect. The mechanical movement of the molten lithium breaks the passivating layer on the lithium target and removes the passivating products from an area, for example the sputtering area, on the target.

The lithium target and optionally the magnetron may be positioned horizontally. This has the advantage of preventing spilling of the molten lithium target.

The method may take place in a chamber containing the lithium target, substrate and optionally a magnetron.

Suitably, energy may be applied to the lithium target at a first rate to cause melting and agitation of liquid lithium in the lithium target during a first time period and at a second, higher rate for vaporising at least part of the agitated lithium target during a second time period.

In a first time period a first power regime may be applied to the lithium target initiate agitation of the molten lithium target, and in a second time period a second power regime may be applied to the lithium target to initiate (increased) vaporisation of at least part of the agitated lithium target. The voltage in the first power regime may be lower than the voltage in the second power regime. The current density in the first power regime may be lower than in the second power regime.

In a preliminary time period, a preliminary power regime may be applied to melt the lithium target. The voltage and/or current density in the preliminary power regime may be less than in the first power regime. Alternatively, the first power regime may be selected to both melt the lithium target and to initiate agitation of the liquid lithium in the lithium target.

The power regimes may be electrical power regimes supplied to a magnetron arranged for magnetron sputtering of vaporised lithium from the lithium target, i.e. ion bombardment of the lithium target.

The first power regime may be selected so that there is not sufficient power for evaporating lithium from the target by thermal evaporation or thermal sputtering. This allows the passivating layer to be removed in the first time period before (increased) vaporisation of lithium may commence in the second time period. This has the advantage of mitigating the problem of arcs which might occur if the passivation layer were exposed to the higher power conditions in the second time period. In addition, by ensuring the passivation layer has been removed before (increased) vaporisation starts, contamination of the coating is reduced.

The magnetohydrodynamic (MHD) effect causes movement of particles in the target material, causing mechanical mixing. This motion causes removal of passivated layers from the lithium target. The passivated layers are pushed away from the surface and clean parts of the target are exposed. The use of the lithium target in the liquid phase allows this motion to occur.

Suitably, the ion current density of the lithium target may be in the range of 10-100 mA/cm$^2$, such as 10-70 mA/cm$^2$, in particular 15-65 mA/cm$^2$, more in particular 15-45 mA/cm$^2$.

Agitating in the lithium target may comprise applying a magnetic field to the lithium target, for example by using a magnetron, to create a magnetohydrodynamic effect in the lithium target. The operation regime of the magnetron may be selected such that the MHD effect causes the spinning effect at a rotational speed of 1-100 rotations per second or translational motion at a speed of 0.1-10 meters/second. A circular or linear magnetron may be used. The MHD effect will cause rotational motion of lithium in a circular magnetron and linear motion in a linear magnetron.

During agitation of the liquid lithium in the lithium target, the temperature of the lithium target may be in the range of 180° C. to 1000° C., such as 180° C. to 300° C. or 180° C. to 500° C. or 500° C. to 1000° C. At high temperatures, the increased rate of deposition is a result of the combination of two different sputtering mechanisms: magnetron sputtering and thermal sputtering. However, the use of the MHD effect also enables a high deposition rate of lithium onto the substrate at lower temperatures.

The present invention has the surprising effect that a relatively low vacuum with a pressure up to $10^{-2}$ mbar can enable effective and safe deposition of lithium onto a substrate. Such a relatively low vacuum has the advantage of reduced cost but has hitherto been considered unsuitable for lithium deposition.

Suitably, the method may take place in a chamber containing working gas and wherein the pressure of the working gas is within the range of $10^{-3}$ to $10^{-2}$ mbar.

The working gas may be selected from argon, neon, helium and other inert gases. The working gas may be selected from a mixture of two or more gases selected from argon, neon, helium and other inert gases. The working gas may be selected from a mixture comprising a first gas comprising argon, neon, helium or other inert gas and a second gas comprising a non-inert gas. For example the non-inert gas may comprise nitrogen.

Melting, agitating and/or vaporisation of the lithium target may be carried out in a pulsed mode. For example, voltage/current supplied to a magnetron arranged for melting and sputtering of vaporised material from the target may be pulsed. Where vaporising at least part of the agitated lithium target comprises thermal evaporation, heat applied to the target may be pulsed.

The magnetron may be powered in a pulsed mode. The voltage applied to the magnetron represents a sequence of unipolar and/or bi-polar pulses. The pulsed power mode may have a sinusoidal, square or other suitable form.

Use of pulsed power reduces the average power to the magnetron and prevents the build-up of charge on passivation products on the lithium target which can result in the production of arcs forming over the surface of the lithium.

The frequency of the pulsed mode may suitably be between 1,000 Hz to 100,000 Hz, such as between about 1,000 Hz to about 60,000 Hz, in particular between about 1,000 Hz to about 50,000 Hz, more in particular between about 10,000 Hz to about 30,000 Hz. The duty cycle defining the ratio between the pulse duration to the period may be in the range of from 0.4 to 1.

The method may result in an advantageously rapid rate of deposition. In an embodiment, the deposition is carried out to achieve a current density of the target of about 40 mA/cm$^2$. In an embodiment, the lithium may be deposited at a rate of 2 µm/min.

The method is suitable for depositing lithium onto any suitable surface. The substrate may comprise a porous material. The porous material may comprise a polymeric material. In an embodiment the polymeric material is formed from one or more ethylenically unsaturated monomers. Suitable polymeric materials include polystyrols, polyolefins or polysulfones, polyamides, polyimides, polybenzimidazoles, polyphenylene oxides, polyetherketones, different types of cellulose and other thermally stable polymers and combinations thereof. In an embodiment, the polymeric material comprises polypropylene and/or polyethylene.

Advantageously, the substrate may be fibrous, i.e. comprise one or more fibres. Conveniently, the fibrous substrate may comprise or consist of a woven or non-woven material. The fibrous material may suitably be formed from fibres of a non-conducting material, such as polymer fibres. Advantageously, the fibres may deform plastically under pressure while maintaining their integrity and mechanical strength. Examples include non-woven fabrics, woven fabrics and mesh (e.g. polymer mesh). Suitable fabrics include polymer fabrics, such as polyalkylene fabrics, polyamides (capron), and nylon. Polypropylene fabrics, in particular polypropylene non-woven fabrics are preferred.

The substrate may comprise or consist of inherently porous material. Alternatively or additionally, pores may be introduced into the substrate, for example, by perforating the substrate by mechanical means.

The substrate may comprise a non-porous material. Suitable examples comprise foil made of nickel, copper, stainless steel and other metals and its alloys, polymer films made of polyethylene oxide, polypropylene, polyethylene terephthalate, polysulfones and other polymers.

A further aspect of the present invention provides a method of forming a lithium coating on a substrate, the method comprising: deposition of a metallic lithium coating on the substrate by magnetron sputtering of a lithium target; characterised in that the lithium target is in the liquid phase and wherein the operation regime of the magnetron is selected to initiate a magnetohydrodynamic effect in the metallic lithium target.

The method may comprise a method for forming a lithium coated electrode for a battery.

The method may comprise making an electrode from the lithium coated substrate, suitably by combining the material with a connector terminal and/or current collector. The method may also comprise making an electrode assembly or electrochemical cell from the electrode.

A further aspect of the present invention provides a lithium coated substrate obtainable by a method according to any aspect or embodiment of the invention.

Aspects of the invention provide an electrode for an electrochemical cell, the electrode comprising a lithium coated substrate according to any aspect or embodiment of the invention or obtainable by a method according to any aspect or embodiment of the invention.

According to a further aspect of the invention, there is provided an electrode for an electrochemical cell, the electrode comprising a lithium coated substrate according to any aspect or embodiment of the invention, or obtainable by any method according to any aspect or embodiment of the invention; and a connection terminal.

In an embodiment, the electrode is a negative electrode.

In an embodiment, the electrode comprises a current collector. The current collector may suitably be a porous current collector, comprising, for example, a conductive metal layer or conductive metal mesh. Suitable conductive metals include stainless steel, nickel and copper.

The electrode may be used in any suitable lithium battery. Examples of suitable lithium batteries include those having cathodes based on transition metal compounds, such as transition metal oxides, sulphides or halides. Specific examples include Li—MnO$_2$ and Li—FeS$_2$ cells. Other examples include lithium cells in which the cathode is based on sulphur dioxide, thionyl chloride, sulfuryl chloride, halogen (e.g. iodine) and carbon monofluoride. Specific examples include Li—SO$_2$, Li—SOCl$_2$, Li—SO$_2$Cl$_2$, Li—(CF)$_x$ and Li—I$_2$ cells.

Aspects of the invention provide an electrode assembly or cell comprising an electrode according to any aspect or embodiment of the invention.

The electrode may, for example, be used in an electrode assembly, such as a stack including consecutively positioned layers of positive and negative electrodes separated with layers of a separator.

According to a further aspect of the invention, there is provided an electrode assembly comprising an anode, a cathode and a separator positioned therebetween, wherein the anode is an electrode according to any aspect or embodiment of the invention. An electrolyte may suitably be present between the anode and cathode.

The separator may suitably be in physical contact with the anode and/or cathode. The electrode assembly or a stack of electrode assemblies may conveniently be sealed in a casing, with connection terminals of the electrodes accessible for application of a potential difference across the anode(s) and cathode(s).

According to a further aspect, the invention provides an electrochemical cell comprising an electrode or electrode assembly according to any aspect or embodiment of the invention.

The electrochemical cell may be a primary cell. Preferably, however, the electrochemical cell is a secondary cell.

The electrochemical cell may include at least one anode and at least one cathode in an electrolyte. The anode is preferably an electrode according to any aspect or embodiment of the invention. The cell may include a plurality of anodes and a plurality of cathodes. Preferably all the anodes of the cell are formed of an electrode according to any aspect or embodiment of the invention. A separator may be placed in between the anode and the cathode. The separator may be in contact with the anode and/or the cathode. The cell may be sealed in a housing, with the terminal of at least one of the anodes and at least one of the cathodes accessible for charge and/or discharge of the cell.

Where used, the separator may be formed of an electrically insulating material. Examples include polyethylene, polypropylene, polyamides, woven glass fabric etc.

The cell may suitably be a lithium ion cell. However, in one embodiment, the cell is not a lithium-ion cell. In one embodiment, the electrochemical cell is a lithium-sulphur cell comprising the electrode as the anode, a sulphur-containing cathode and an electrolyte. A further aspect provides a lithium coated substrate formed by the method of this invention.

The lithium coated substrate formed by the method of this invention is suitable for many uses, for example those that require high power density, high energy density, increased safety, cycle and calendar life.

Throughout the description and claims of this specification, the words "comprise" and "contain" and variations of the words, for example "comprising" and "comprises", mean "including but not limited to", and do not exclude other moieties, additives, components, integers or steps. Moreover the singular encompasses the plural unless the context otherwise requires: in particular, where the indefinite article is used, the specification is to be understood as contemplating plurality as well as singularity, unless the context requires otherwise.

Preferred features of each aspect of the invention may be as described in connection with any of the other aspects. Other features of the invention will become apparent from the following examples. Generally speaking the invention extends to any novel one, or any novel combination, of the features disclosed in this specification (including any accompanying claims and drawings). Thus features, integers, characteristics, compounds, chemical moieties or groups described in conjunction with a particular aspect, embodiment or example of the invention are to be understood to be applicable to any other aspect, embodiment or example described herein unless incompatible therewith. Moreover unless stated otherwise, any feature disclosed herein may be replaced by an alternative feature serving the same or a similar purpose.

Where upper and lower limits are quoted for a property then a range of values defined by a combination of any of the upper limits with any of the lower limits may also be implied.

In this specification—unless stated otherwise—properties are measured under standard temperature and pressure.

The present invention will now be further described with reference to the following non-limiting examples and the accompanying illustrative drawings, of which:

Figure 1:
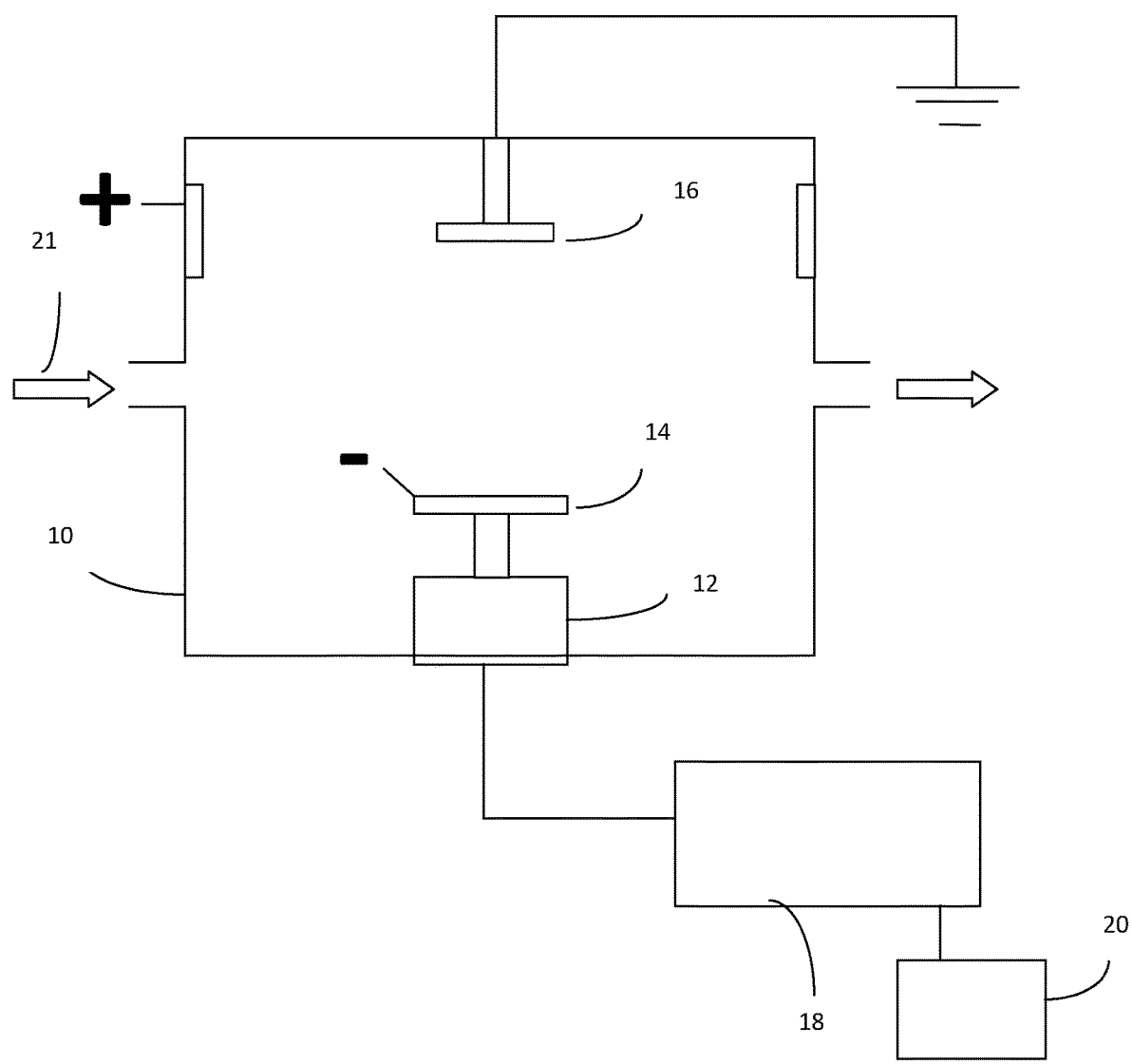
FIG. 1 is a schematic illustration of a magnetron chamber.

FIG. 1 shows a simplified vacuum chamber suitable for coating an electrode substrate in accordance with an embodiment of the invention. The chamber 10 contains a magnetron 12, lithium target 14 and electrode substrate 16. The magnetron 12 and lithium target 14 (acting as the cathode) are connected to a power supply unit 18. A controller 20 controls the voltage and current of the power supply unit 18 and enables the power to be supplied to the magnetron.

Figure 2:
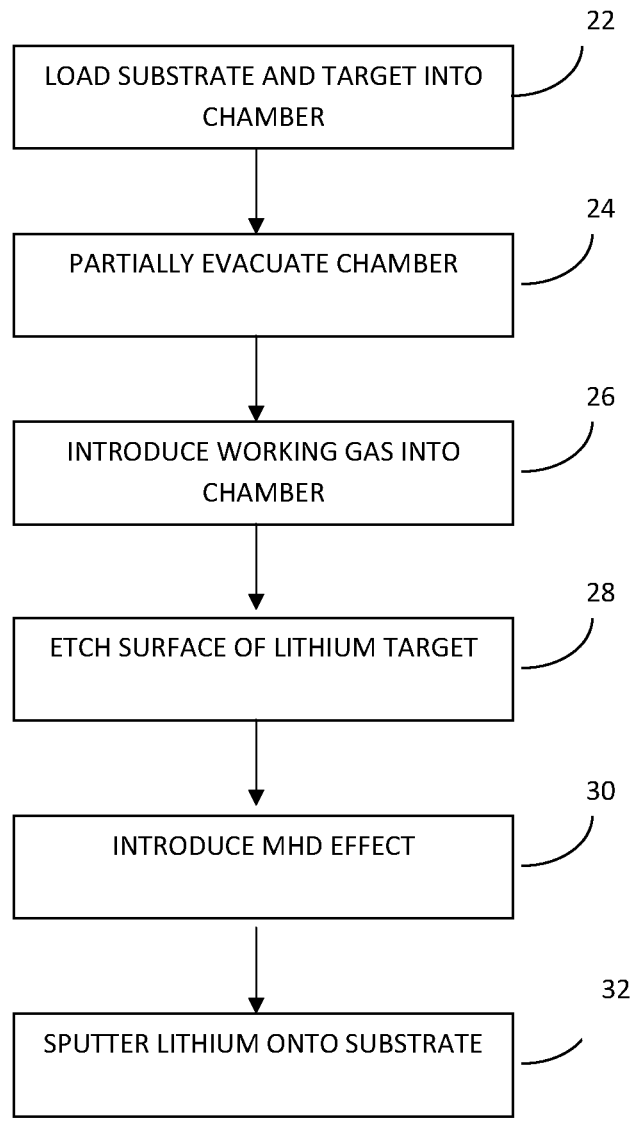
FIG. 2 is a flow diagram showing a method of forming a lithium coating in accordance with an embodiment of the invention.

An embodiment of a method according to the invention is shown in FIG. 2. A substrate and a lithium target are loaded into the chamber 22 and the chamber is partially evacuated 24. The chamber is then filled with working gas at a low pressure 26, typically an inert gas such as argon. The current and voltage applied to the magnetron are set to produce conditions under which the surface film on the lithium target is etched 28. The current and voltage settings are next adjusted to melt the lithium and create conditions for the magnetohydrodynamic effect (MHD) 30 which results in the onset of slow rotation of molten lithium; the rotation speed being defined by current density on the target surface. As a result of this rotation, the surface of the lithium target gets mechanically cleaned, thus continuously removing the surface coating from the sputtering area. The current and voltage are then set to a sputtering regime or mode to sputter the lithium onto the substrate 32.

EXAMPLE 1

A rectangular sample of non-woven polypropylene of 6 cm×4 cm was placed at the height of 6 cm over a horizontally positioned magnetron with lithium target. The magnetron, non-woven sample and lithium target were set up in a magnetron chamber and pumped down to $10^{-4}$ mmHg ($10^{-4}$ mbar). The magnetron chamber was further filled with dry argon such that the pressure in the chamber reached $5\times10^{-3}$ mbar. A power supply unit was used to control current and voltage to the magnetron.

A purpose built controller was used to provide pulse power with regulated frequency in the range 1-50 kHz and a duty cycle of about 0.5.

The initial magnetron discharge was at constant current densities on the target of 20 mA/cm$^2$ and a voltage amplitude of about −200V. Under these conditions, etching of the lithium target was initiated.

The voltage was then increased to −260V, whilst keeping the current at the same level. Under these conditions the lithium target melted.

The voltage was then increased to −300V, to initiate agitation of the liquid lithium by the magnetohydrodynamic effect.

To achieve deposition by sputtering in a sputtering mode, the current density on the target was increased to 40 mA/cm2. The voltage was gradually increased to −320V. Under these conditions, deposition rates of 2 μm/min (or 0.4 mAh/min) were observed.

Sputtering was continued for 5 minutes, following which a metallic lithium coating had been deposited on the sample with thickness 10 μm.

EXAMPLE 2

The sputtering of metallic lithium target was carried out on a copper foil substrate. The pressure in the vacuum chamber was similar to that of Example 1 with the distance from the target to the sample being 4 cm.

The power supply to the magnetron discharge was set to pulse at a frequency of 20 kHz and duty cycle about 0.5.

The voltage was initially set at 400V to melt the lithium target with current density of −50 mA/cm2.

During transition from liquid phase to the sputtering regime the voltage amplitude was changing from 400 to 460V. During this transition, agitation of the liquid lithium was observed.

In sputtering mode, the current density on the target was 50 mA/cm2 and the voltage was 460V. During sputtering, which lasted for 3 minutes, the surface of the copper substrate was coated by lithium with a thickness of 6 μm.

EXAMPLE 3

The sputtering of metallic lithium target was carried out on a copper foil substrate. The working pressure in the chamber was set in the following way: the system was pumped down to the working pressure of $5\times10^{-3}$ mbar, then it was purged with argon at the same pressure for 30 min. This was followed by using the same method as described in Example 2.

During sputtering, which lasted 3 minutes, the copper substrate was coated by lithium with a thickness of 6 µm.

EXAMPLE 4

The sputtering of metallic lithium was carried out using a method similar to Example 3, with the exception that the substrate material was a 3×4 cm piece of non-woven polypropylene.

The current discharge was stabilised at 20 mA/cm² for the steps of melting the lithium target, initiating agitation in the lithium target and sputtering mode.

During the sputtering time of 1.5 minutes, the polypropylene substrate was coated with lithium to a thickness of 0.6 µm.

EXAMPLE 5

In a comparative example, the conditions of example 1 were repeated but limiting the voltage the current density on the lithium target to prevent the magnetohydrodynamic effect.

A rectangular sample of non-woven polypropylene of 6 cm×4 cm was placed at the height of 6 cm over a horizontally positioned magnetron with lithium target. The magnetron, non-woven sample and lithium target were set up in a magnetron chamber and pumped down to $10^{-4}$ mmHg ($10^{-4}$ mbar). The magnetron chamber was further filled with dry argon such that the pressure in the chamber reached $5\times10^{-3}$ mbar. A power supply unit was used to control current and voltage to the magnetron.

A purpose built controller was used to provide pulse power with regulated frequency in the range 1-50 kHz and a duty cycle of about 0.5.

The initial magnetron discharge was at constant current densities on the target of 20 mA/cm² and a voltage amplitude of about −200V. Under these conditions, etching of the lithium target was initiated.

The voltage was then increased to −260V, whilst keeping the current at the same level. Under these conditions the lithium target melted.

Under these conditions, no magnetohydrodynamic effect was observed. Some etching and evaporation of the lithium target was observed but no coating was deposited on the substrate surface.

The invention claimed is:

1. A method of forming a lithium coating on a substrate, the method comprising: melting a solid lithium target to form a molten lithium target; agitating the molten lithium target by creating a magnetohydrodynamic effect in the molten lithium target; vaporising at least part of the agitated molten lithium target to form vaporised material; and condensing the vaporised material on a substrate to form a lithium coating.

2. The method according to claim 1, wherein the molten lithium target comprises a passivation layer that is at least partly dispersed by the agitating.

3. The method according to claim 1, wherein vaporising at least part of the agitated molten lithium target comprises bombardment of the molten lithium target with energetic particles.

4. The method according to claim 1, wherein vaporising at least part of the agitated molten lithium target comprises magnetron sputtering.

5. The method according to claim 1, wherein the method takes place in a chamber containing the solid lithium target, the substrate and, optionally, a magnetron.

6. The method according to claim 1, wherein in a first time period a first power regime is applied to the solid lithium target to melt the solid lithium target and initiate agitating of the molten lithium target and in a second time period a second power regime is applied to the molten lithium target to initiate increased vaporisation of at least part of the agitated molten lithium target.

7. The method according to claim 6, wherein a current density in the first power regime is lower than in the second power regime.

8. The method according to claim 7, wherein in a preliminary time period, a preliminary power regime is applied to further melt the solid lithium target, wherein the current density in the preliminary power regime is lower than in the first power regime.

9. The method according to claim 1, wherein a current density of the solid lithium target is in the range of 10-1000 mA/cm².

10. The method according to claim 1, wherein the method takes place in a chamber containing working gas and wherein a pressure of the working gas is within the range of $10^{-3}$ to $10^{-2}$ mbar.

11. The method according to claim 10, wherein the working gas is selected from argon, neon, helium, a mix of inert gases and a mix of inert gases with other gases.

12. The method according to claim 1, wherein melting, agitation, and vaporisation of the lithium target is carried out by a magnetron operating in a pulsed mode.

13. The method according to claim 12, wherein a frequency of the pulsed mode is between 1000 Hz and 100000 Hz and wherein a duty cycle of the pulsed mode is 0.4 to 1.

14. The method according claim 1, wherein the substrate comprises a porous material.

15. The method according to claim 1, wherein the substrate comprises a non-porous material.

16. The method according to claim 1, wherein the method comprises a method for forming a lithium coated electrode for an electrochemical cell.

17. A method of forming a lithium coating on a substrate, the method comprising: melting a solid lithium target comprising a passivation layer to form a molten lithium target; agitating the molten lithium target by creating a magnetohydrodynamic effect therein with a magnetron to at least partly disperse the passivation layer within the molten lithium target; vaporising at least part of the agitated molten lithium target to form vaporised material by magnetron sputtering with the magnetron; and condensing the vaporised material on a substrate to form a lithium coating.

18. A method of forming a lithium coating on a substrate, the method comprising: melting a solid lithium target comprising a passivation layer to form a molten lithium target; agitating the molten lithium target by creating a magnetohydrodynamic effect therein with a magnetron operating in a pulsed mode to at least partly disperse the passivation layer within the molten lithium target; vaporising at least part of the agitated molten lithium target to form vaporised material by magnetron sputtering with the magnetron in a pulsed mode; and condensing the vaporised material on a substrate to form a lithium coating.

* * * * *